United States Patent [19]

Ono

[11] Patent Number: 5,372,754

[45] Date of Patent: Dec. 13, 1994

[54] LIQUID VAPORIZER/FEEDER

[75] Inventor: Hirofumi Ono, Shiga, Japan

[73] Assignee: Lintec Co., Ltd., Shiga, Japan

[21] Appl. No.: 25,500

[22] Filed: Mar. 3, 1993

[30] Foreign Application Priority Data

Mar. 3, 1992 [JP] Japan ................................. 4-82860

[51] Int. Cl.⁵ ............................................... B01F 3/04
[52] U.S. Cl. .................................... 261/142; 261/78.2;
261/DIG. 65; 118/726; 239/137; 239/424
[58] Field of Search ............... 116/722, 724; 239/135,
239/136, 137, 139, 402, 424; 261/78.2, 142,
DIG. 65; 118/726

[56] References Cited

U.S. PATENT DOCUMENTS

| | | | |
|---|---|---|---|
| 921,934 | 5/1909 | Willard | 261/156 |
| 2,763,575 | 9/1956 | Bede | 239/139 X |
| 3,121,639 | 2/1964 | Bauer et al. | 239/139 X |
| 3,954,921 | 5/1976 | Yoshida et al. | 261/78.2 X |
| 4,276,243 | 6/1981 | Partus | 261/142 X |
| 4,916,077 | 4/1990 | Forster et al. | 261/78.2 X |

OTHER PUBLICATIONS

European Patent Application No. 0,058,571, Feb. 17, 1982.
European Patent Application No. 0,420,596, Sep. 25, 1990.

*Primary Examiner*—Tim Miles
*Attorney, Agent, or Firm*—Edwin E. Greigg; Ronald E. Greigg

[57] ABSTRACT

In a liquid vaporizing/feeding method of the present invention, carrier gas is forced out at a very high speed against a mass flow controlled liquid feedstock to change the liquid feedstock into a mist; after that, the mist of the feedstock is vaporized and mixed with the carrier gas, and a mixture of the mist and carrier gas is furnished to a succeeding process. A liquid vaporizer/feeder according to the present invention comprises a main vaporized unit which is cylindrical in shape, and a mist nozzle having an inside nozzle fixed in an inlet of the main vaporizer unit for feeding liquid feedstock into the main vaporizer unit and an outside nozzle encompassing an opening of the inside nozzle for forcing a carrier gas at high speed around the opening of the inside nozzle, and the main vaporizer unit has an evaporation space where a mixed mist of the liquid feedstock with the carrier gas that is forced out of the mist nozzle is vaporized.

4 Claims, 7 Drawing Sheets

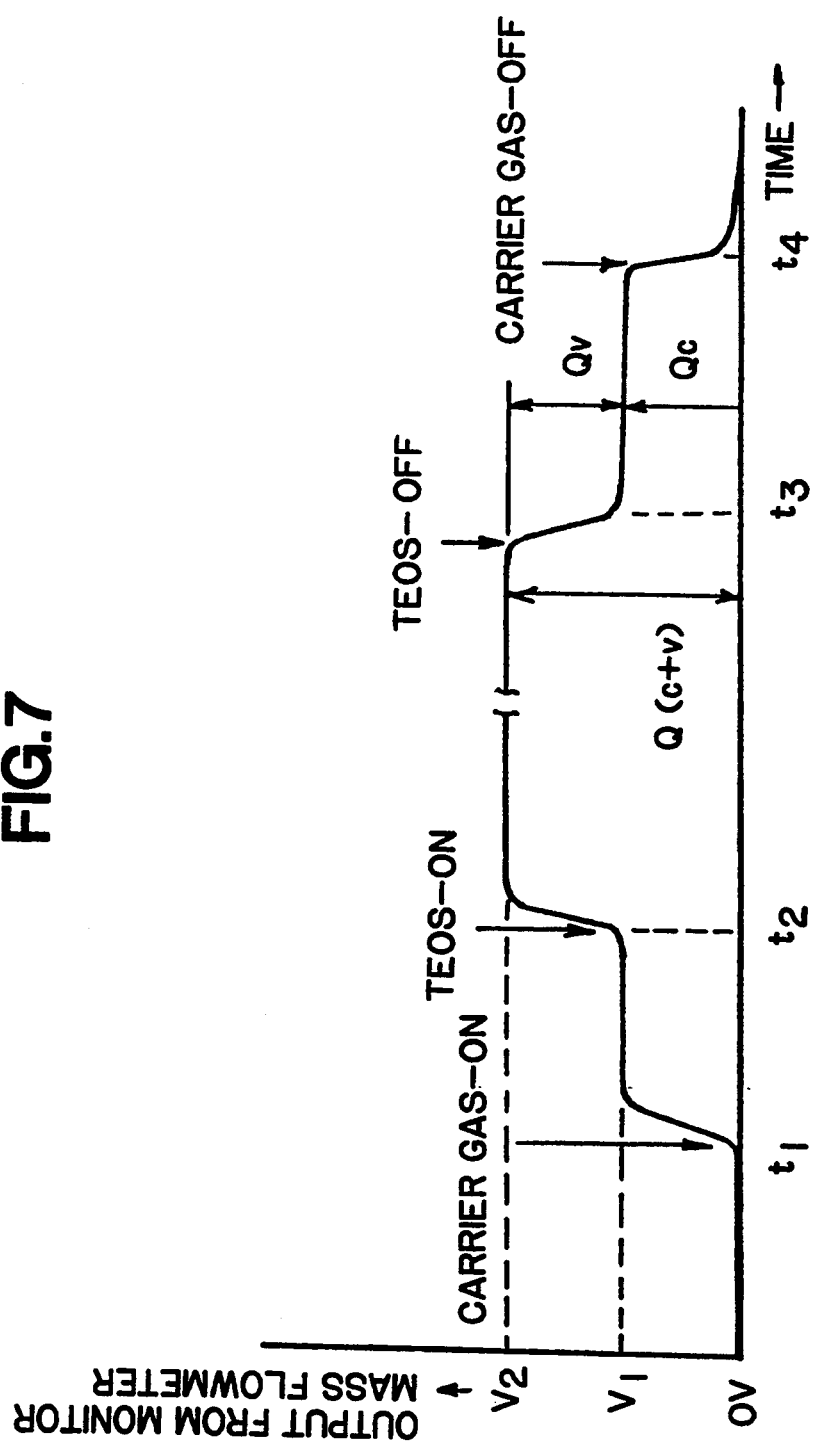

LIQUID VAPORIZER/FEEDER

BACKGROUND OF THE INVENTION

The present invention relates to a mass flow controlled liquid vaporizing/feeding method of vaporizing liquid feedstock and feeding the resultant gas at an accurate mass flow to a succeeding process, and to a liquid vaporizer/feeder utilizing the method.

A mass flow controlled liquid vaporizing/feeding method, where liquid feedstock is vaporized and the resultant gas is fed at an accurate mass flow to a succeeding process, and a liquid vaporizer/feeder utilizing the method are used in various industrial fields. We herein will explain a liquid vaporizing/feeding method and a liquid vaporizer/feeder utilizing the method in exemplary situations where they are applied to a semiconductor fabricating process, and particularly, to an atmospheric pressure CVD apparatus for forming thin film on a surface of a wafer. It should be noted that the present invention is not to be applied only to the semiconductor fabricating process.

Although feedstock furnished to a CVD apparatus or process has conventionally been a gaseous matter, semiconductor gas has adverse attributes such as explosiveness, virulent poisonousness, corrosiveness, etc., and hence, in recent years liquid feedstock has been gradually used in view of safety and allowing for manufacturing thin films of excellent properties.

Such gaseous feedstock includes, for example, TEOS (Tetra Ethyl Ortho Silicate). A bubbling system as shown in FIG. 8 is employed as a feeding system of TEOS to an atmospheric pressure CVD apparatus; however, it has various disadvantages as mentioned later and is already difficult to apply to the next generation devices of more enhanced integration.

FIG. 8 depicts a liquid vaporizing/feeding system utilizing the prior art bubbling mechanism for the semiconductor fabricating process, and the disadvantage of the system will be described below:

In FIG. 8, there are depicted a liquid mass flow controller MFC, liquid feedstock L, tank-like feedstock reservoir T, mass flowmeter MFM, and a furnace (e.g., atmospheric pressure CVD apparatus). Also depicted are an output flow rate Vc of a carrier gas C, an output flow rate Vv of a feedstock gas, a mass flow rate Qc of the carrier gas discharged from the mass flow controller, and a mass flow rate Qv of the feedstock gas.

Referring to FIG. 8, when the mass flow controlled carrier gas C expressed by the flow rate Qc is injected into the reservoir filled with the liquid feedstock L to pressurize it, bubbles of the carrier gas C rise in the liquid feedstock L. Part of the liquid feedstock L is vaporized under the vapor pressure of the liquid feedstock L and flows out of the reservoir T, mixed with the carrier gas C. The mass of vapor-gas mixture manufactured in this manner (referred to as "mixed gas MG" hereinafter) is represented by (Qc+Qv). Mass flow of the mixed gas MG is measured by the mass flowmeter MFM. A measure obtained is output as (Vc+Vv) by the mass flowmeter MFM. The output flow rate Vv of only the liquid feedstock L can be obtained by subtracting the output value Vc of only the carrier gas C from the output value (Vc+Vv). If the resultant output value is fed back to the mass flow controller MFC and controlled therein, a constant mass flow of the feedstock gas can be continuously fed, and the mass flow can be set to any desirable value as required.

However, although the feeding system of the liquid feedstock L utilizing the above-mentioned bubbling mechanism can be used when a ratio of the feedstock gas of the liquid feedstock L to the carrier gas C sensed by the mass flowmeter MFM is relatively large, it often cannot actually be employed because of an extremely bad accuracy when the ratio is small.

Additionally, since it is very difficult to determine conditions of the bubbling, a good accuracy cannot be expected even in the case where the bubbling mechanism can be applied, and there is almost no way of applying the feeding system to the expected next generation semiconductors in the near future.

An applicable range of the bubbling capacity is very small, unadjustable from the desired minimum level to the maximum. Moreover, there are various disadvantages; for example, a mist caused by the bubbling flows into the mass flowmeter MFM along with the carrier gas C and is gathered therein to cause an error or cause malfunction.

Accordingly, it is an object of the present invention to perfectly vaporize liquid feedstock and feed feedstock gas continuously at an extremely high accuracy of mass flow with adjustability of a wide range of vaporizing/feeding capacity from the desired minimum level to the maximum, so as to be satisfactory for manufacturing the next generation semiconductors.

SUMMARY OF THE INVENTION

In a liquid vaporizing/feeding method of the present invention, (i) a carrier gas (C) is jetted out at a very high speed against a mass flow controlled liquid feedstock (L) into mist; (ii) after that, the mist of the feedstock (MM) is vaporized and mixed with the carrier gas (C), and a mixture of them is furnished to a succeeding process.

As stated above, since the liquid feedstock is perfectly transformed into a mist, the resultant mixed mist is very easily vaporized because the total area per volume of the mixed mist rapidly increases, and eventually, it is possible to perfectly vaporize the liquid feedstock. In accordance with the method where the liquid feedstock is once transformed into a mist and then vaporized, a range of evaporation capacity is adjustable widely from the desired minimum level to the maximum level, and since a mass flow of the vaporized feedstock is precisely controlled, a certain mass flow of the feedstock gas can be continuously furnished at very high accuracy.

A liquid vaporizer/feeder according to the present invention comprises a main vaporizer unit (2) which is cylindrical in shape, and a mist nozzle (3) having an inside nozzle (3a) fixed in an inlet of the main vaporizer unit (2) for feeding liquid feedstock (L) into the main vaporizer unit (2) and an outside nozzle (3b) encompassing an opening of the inside nozzle (3a) for jetting the carrier gas (C) at a high speed around the opening of the inside nozzle (3a), and the main vaporizer unit (2) has an evaporation space (ES) where mist (MM) of the liquid feedstock mixed with carrier gas jetted out of the mist nozzle (3) is vaporized.

In the liquid vaporizer/feeder, because of the so-called venturi effect caused by the carrier gas (C) jetted at a high speed out of the outside nozzle (3b), the liquid feedstock (L) jetted out of the inside nozzle (3a) is compressed into a mist and dispersed in the evaporation space (ES) of the main vaporizer unit (2). Since the total area per volume of the mixed mist (MM) rapidly increases, vaporization of the mixed mist can be facilitated to the level of perfect evaporation.

Preferably, a plurality of mass flow controlled liquid feedstock feeding pipes, (6a, 6b, 6c, and so forth) may be connected to the inside nozzle (3a). Various kinds of liquid feedstock can be mixed in a liquid state and vaporized, and eventually, mixed gas can be furnished to a succeeding process.

Further preferably, a plurality of mist nozzles (3) may be fixed in a main vaporizer unit (2). Then, various kinds of gasses can be mixed in an evaporation space (ES).

According to the liquid vaporizing/feeding method of the present invention, since a carrier gas is jetted out at a high speed against a mass flow controlled liquid feedstock to make a mixed mist of the carrier gas with the liquid feedstock, the total area per volume of the mixed mist rapidly increases. This facilitates vaporization, and consequently, the liquid feedstock can be vaporized under the boiling point. Moreover, even with a liquid feedstock which is thermally decomposed easily, it can be vaporized without thermal decomposition. It is also possible to vaporize the liquid feedstock at a high pressure because it is transformed into mist. The liquid Feedstock is supplied to the vaporizer at atmospheric temperature, and therefore, problems such as decomposition caused by heating, polymerization, etc. can be avoided. As has been described, since the liquid feedstock a first transformed into a mist and mixed with the carrier gas it is evaporated and furnished to a succeeding process, the liquid feedstock can be perfectly vaporized and a range of evaporation capacity can be selected from the desired minimum level to the maximum. Furthermore, the mass flow of the liquid feedstock to be vaporized is precisely controlled, and therefore, the intended mixed gas can be continuously furnished at a very high accuracy of mass flow.

In the liquid vaporizer/feeder according to the present invention, it is comprised of the cylindrical main vaporizer unit with the evaporation space therein for evaporating the mixed mist, and a mist nozzle having an inside nozzle fixed in the inlet of the main vaporizer unit for the feeding liquid feedstock into the main vaporizer unit and an outside nozzle encompassing the opening of the inside nozzle for jetting carrier gas at high speed around the opening of the inside nozzle. Thus, the liquid vaporizer/feeder is characterized by its very simple configuration, low cost in manufacturing, capability of downsized design, and facilitation of maintenance, checking, cleaning, etc.

In another aspect of the liquid vaporizer/feeder according to the present invention, the plurality of mass flow controlled liquid feedstock feeding pipes are connected to the inside nozzle, and thus, only with this system unit, various kinds of feedstock can be simultaneously mixed and then vaporized.

In still another aspect of the liquid vaporizer/feeder according to the present invention, the plurality of mist nozzles are fixed in the main vaporizer unit, various kinds of gas can be mixed in the evaporation space, unlike the above aspect.

BRIEF DESCRIPTION OF THE DRAWINGS

FIG. 7 is a graph illustrating a relation between output records of a mass flowmeter and time under the condition where the mass flowmeter is positioned on a side of an outlet of a liquid vaporizer to check performance of the liquid vaporizer/feeder according to the present invention.

DESCRIPTION OF THE PREFERRED EMBODIMENT

Figure 1:
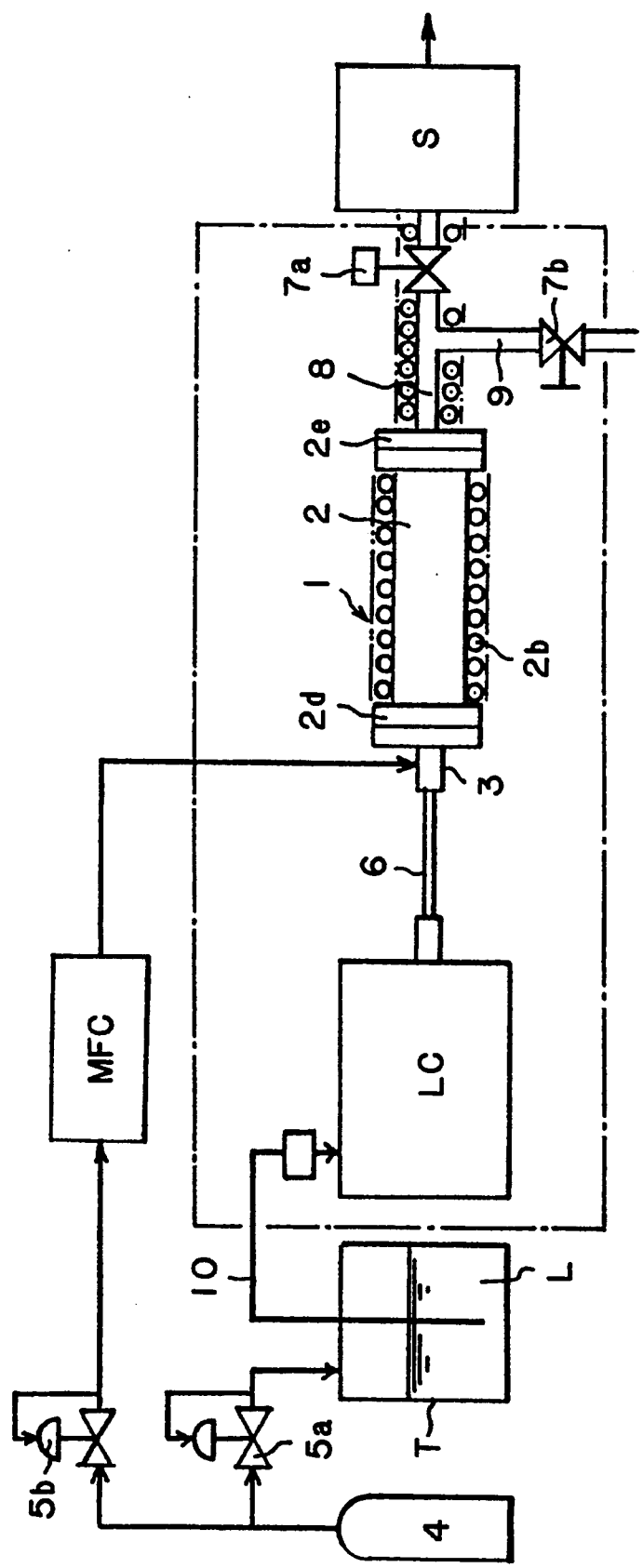
FIG. 1 is a flow diagram in a liquid vaporizing/feeding system according to the present invention.

What are now deemed to be preferred embodiments of the present invention will be described with reference to the accompanying drawings. FIG. 1 is a flow diagram showing a liquid vaporizing/feeding system according to the present invention, where depicted are a pressure tank 4 containing carrier gas, a pressure regulator 5b for the carrier gas, a mass flow controller MFC for carrier gas, a pressure regulator 5a for pressurizing gas, a tank-like reservoir T containing liquid feedstock, a liquid mass flow controller LC, a liquid feedstock feeding pipe 6, a vaporizer/feeder 1, valves 7a and 7b, and a furnace S which is an atmospheric pressure CVD apparatus in this embodiment.

The pressure tank 4 is, for example, filled with nitrogen which is furnished to the reservoir T, at a specified pressure by the pressure regulator 5a to continuously keep the reservoir T at the specified pressure.

The reservoir T contains liquid feedstock L, and the pressure in the reservoir regulated by the pressure regulator 5a causes the liquid feedstock L to flow into the liquid mass flow controller LC.

The liquid mass flow controller LC is comprised of a sensor, a bypass, and a control valve (all of which are not shown). In the bypass, the liquid feedstock L flows at fixed magnifications as much as the mass flow of the liquid feedstock L flowing in the sensor. The sensor converts heat transfer caused by the liquid feedstock L flowing in a pipe therein into voltage to detect the mass flow of the liquid feedstock L, and the control valve regulates a valve opening level in accordance with a detected value to control the mass flow of the liquid feedstock L. This mechanism and control method are well-known in the art.

The liquid feedstock feeding pipe 6 connects an outlet of the liquid mass flow controller LC to an inner nozzle 3a of a mist nozzle 3 fixed in an inlet of the vaporizer/feeder 1.

Figure 2:
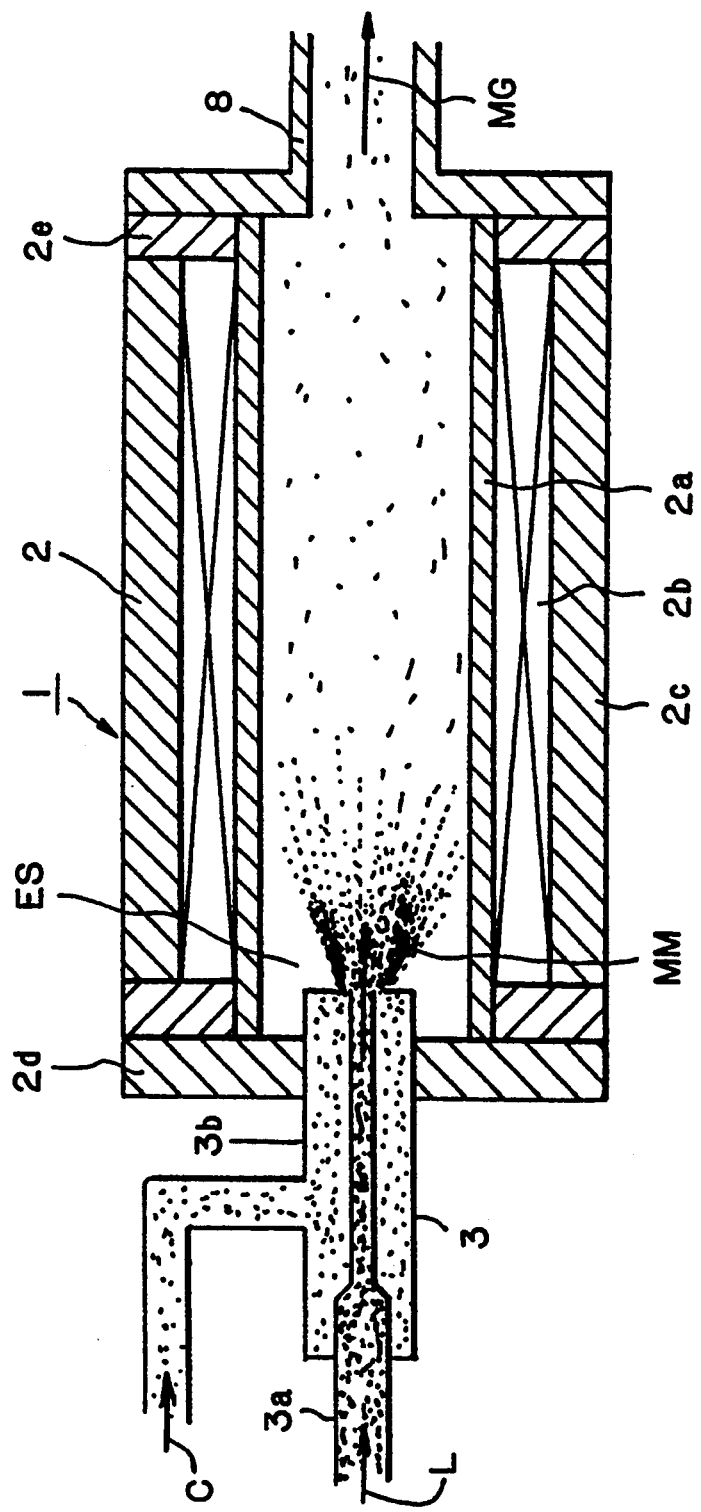
FIG. 2 is a sectional view of a first preferred embodiment of a liquid vaporizer/feeder according to the present invention.

FIG. 2 shows a first preferred embodiment of the liquid vaporizer/feeder 1 according to the present invention, where a tubular (cylindrical in this embodiment) main vaporizer unit 2 includes a heating cylinder 2a in an innermost position, a heater 2b enclosing the heating cylinder 2a, and a heat insulator 2c further enclosing the heater 2b. Configured in this manner, the main vaporizer unit 2 has a characteristic of heat insulating and heats an evaporation space ES defined within the main vaporizer unit 2 as required. It also includes flanges 2d and 2e; a mist nozzle 3 is fixed on the inlet flange 2d, and a gas discharging pipe 8 is fixed on the outlet flange 2e.

The mist nozzle 3 has the inside nozzle 3a and an outside nozzle 3b; the inside nozzle 3a is connected to the liquid feedstock feeding pipe 6 extending from the outlet of the liquid mass flow controller LC while the outside nozzle 3b encloses the inside nozzle 3a and an opening of the outside nozzle 3b encompasses an opening of the inside nozzle 3a. The carrier gas C jetted out of the opening of the outside nozzle 3b causes the so-called venturi effect to compress the opening of the inside nozzle 3a in negative pressure, and then, the liquid feedstock L flowing through the inside nozzle 3a is jetted out in a mist.

The valves 7a and 7b are attached to the gas discharging pipe 8 and a purge pipe 9 connected thereto, and a terminal of the gas discharging pipe 8 leads to the furnace S. The furnace S is an atmospheric pressure CVD apparatus in this embodiment.

Opening the pressure regulator 5a, the carrier gas C is fed from the tank 4 to the reservoir T, and keeping the reservoir T at a fixed pressure, the liquid feedstock L is furnished through a pipe 10 to the liquid mass flow controller LC. Part of the liquid feedstock L in the liquid mass flow controller LC flows through the sensor. At this time, the sensor converts heat transfer of the liquid feedstock flowing in a sensor tube into voltage to detect mass flow of the liquid feedstock L, and the liquid feedstock L flows through the bypass at a fixed magnifications as much as the mass flow of the liquid feedstock L flowing in the sensor, as previously mentioned. Thus, the valve is controlled in its opening level in accordance with a value detected by the sensor, and thus, the mass flow of the liquid feedstock L can be accurately controlled. The liquid feedstock L controlled in this way further flows into the inside nozzle 3a of the mist nozzle 3 placed at the inlet of the liquid vaporizer/feeder 1.

As to the mist nozzle 3, the carrier gas C kept at a specified pressure by the pressure regulator 5b is fed into the outside nozzle 3b and then jetted out of a terminal outlet of the outside nozzle 3b into the liquid vaporizer/feeder The carrier gas C causes the venturi effect to compress the opening of the inside nozzle 3a in negative pressure so that the liquid feedstock L is jetted in a mist out of the inside nozzle 3a, as mentioned above, and the mist of the liquid feedstock L mixed with the carrier gas C flows into the liquid vaporizer/feeder 1.

As to the liquid feedstock L in a mist in the liquid vaporizer/feeder 1, a diameter of a mist particle is, for example, 1 $\mu$ or under, the total area per volume of the mist is extraordinary large, and the mist can be easily evaporated in this situation. Then, a perfect vaporization of the liquid feedstock L can be attained in an ordinary state, and additionally, the liquid feedstock L can be vaporized under the boiling point. Hence, even with liquid feedstock which is thermally decomposed easily, it can be vaporized without thermal decomposition. It is also possible to vaporize the liquid feedstock L at high pressure because it is transformed into a mist. In addition to that, vaporization can be facilitated if the evaporation space ES defined by the heater 2b in the main vaporizer unit 2 is heated. The heater 2b is used depending upon properties of the liquid feedstock L as required. In this way, mixed mist MM is perfectly vaporized with a specified mass flow. The liquid mass flow controller LC permits the operator to adequately select a flow rate from the desired minimum level to the maximum under extremely precise control.

The liquid feedstock L flows into the vaporizer 1 at atmospheric temperature, and therefore, problems such as decomposition caused by heating, polymerization, etc. never arise.

Mixed gas MG of the vaporized feedstock and the carrier gas flows through the gas discharging pipe 8 into the furnace S to practice some treatment for a predetermined reaction, and thereafter, semiconductor exhaust gas is furnished to a process of producing harmless gas, and then, released in the air.

Figure 3:
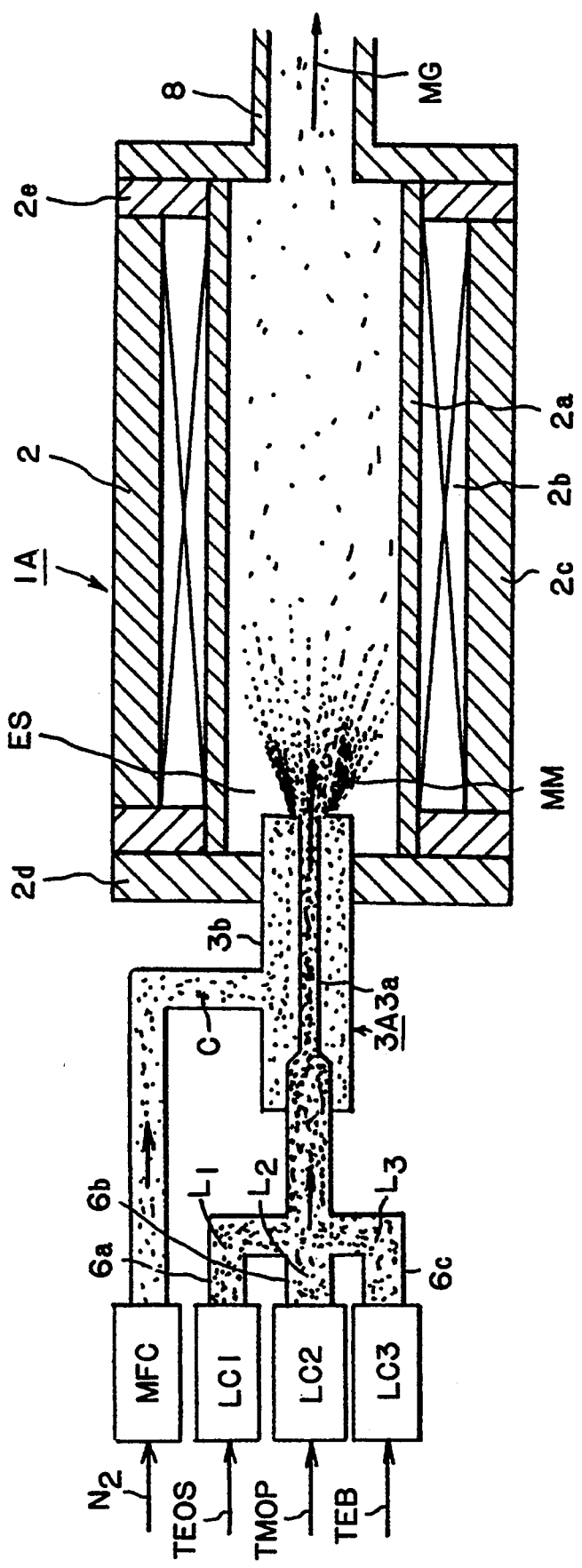
FIG. 3 is a sectional view of a second preferred embodiment of the liquid vaporizer/feeder according to the present invention.

FIG. 3 depicts a second preferred embodiment of a liquid vaporizer/feeder 1A according to the present invention, used in a case where various kinds of liquid feedstock, L1, L2, L3 and so forth, are mixed and vaporized. In this case, a plurality of (three in this embodiment) liquid feedstock feeding pipes, 6a, 6b, 6c and so forth, are connected to an inside nozzle 3a of a mist nozzle 3A, and various kinds (three kinds) of liquid feedstock, L1, L2, L3 and so forth, are mixed in the inside nozzle 3a. After that, mixture of them is transformed into a mist, utilizing the previously mentioned venturi effect caused by carrier gas C. In this case, the single mist nozzle 3A is enough although the various kinds of liquid feedstock, L1, L2, L3 and so forth, can be used in mixture, and a very slight increase in cost permits one to implement an improved facility related to this embodiment.

Three kinds of liquid feedstock mixed together in this embodiment include TEOS, TMB, TMP, etc., which are used for producing a BPSG film. First, second and third liquid mass flow controllers, LC-1, LC-2 and LC-3, control TEOS, TMB and TMP, respectively.

Figure 4:
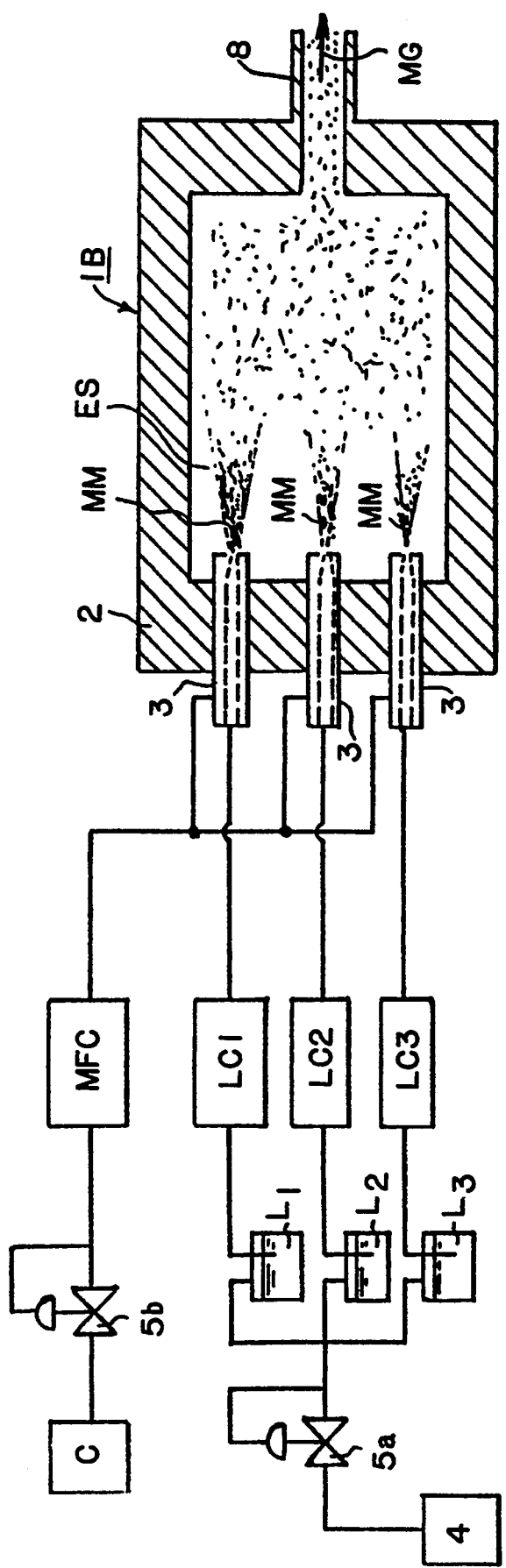
FIG. 4 is a sectional view of a third preferred embodiment of the liquid vaporizer/feeder according to the present invention.

FIG. 4 depicts a third preferred embodiment of a liquid vaporizer/feeder 1B, where a plurality of mist nozzle 3 are attached to a main vaporizer unit 2. Each of the mist nozzles 3 is configured similar to that in the first preferred embodiment.

Figure 5:
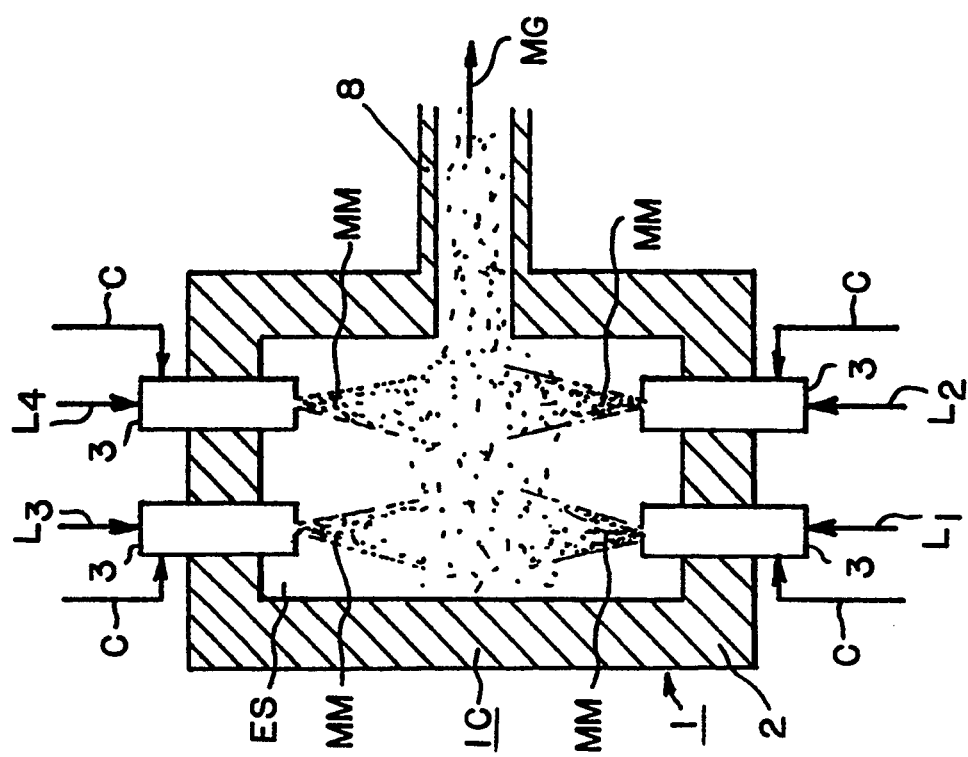
FIG. 5 is a sectional view of a fourth preferred embodiment of the liquid vaporizer/feeder according to the present invention.
Figure 8:
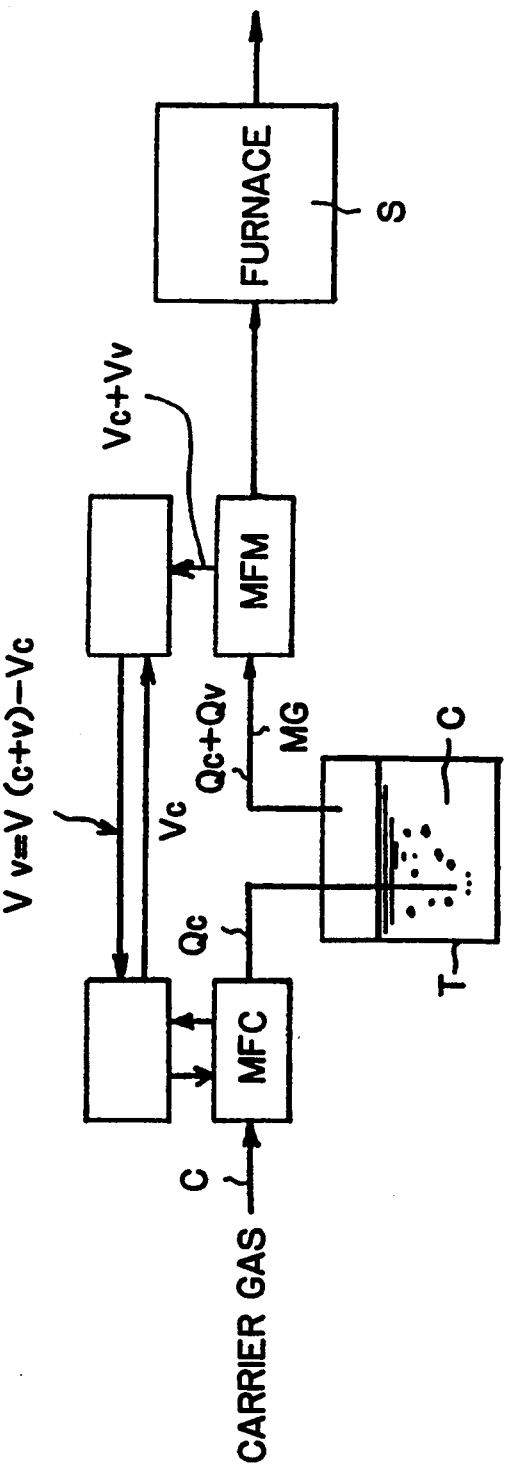
FIG. 8 is a flow diagram showing a prior art liquid vaporizer/feeder.

FIG. 5 depicts a fourth preferred embodiment of a vaporize 1C, where a plurality of mist nozzles 3 are connected to opposite sides of the vaporizer 1C so that various kinds of liquid feedstock L1 are jetted out in mist towards the center of evaporation space ES from the opposite sides and mixed there. Inside the vaporizer 1C, turbulent flow arises to mix various kinds of gas very efficiently, and eventually, uniform mixed gas MG can be obtained. The mixed gas MG flows through a gas discharging pipe 8 extending from the center of a main vaporizer unit 2 into furnace S.

Figure 6:
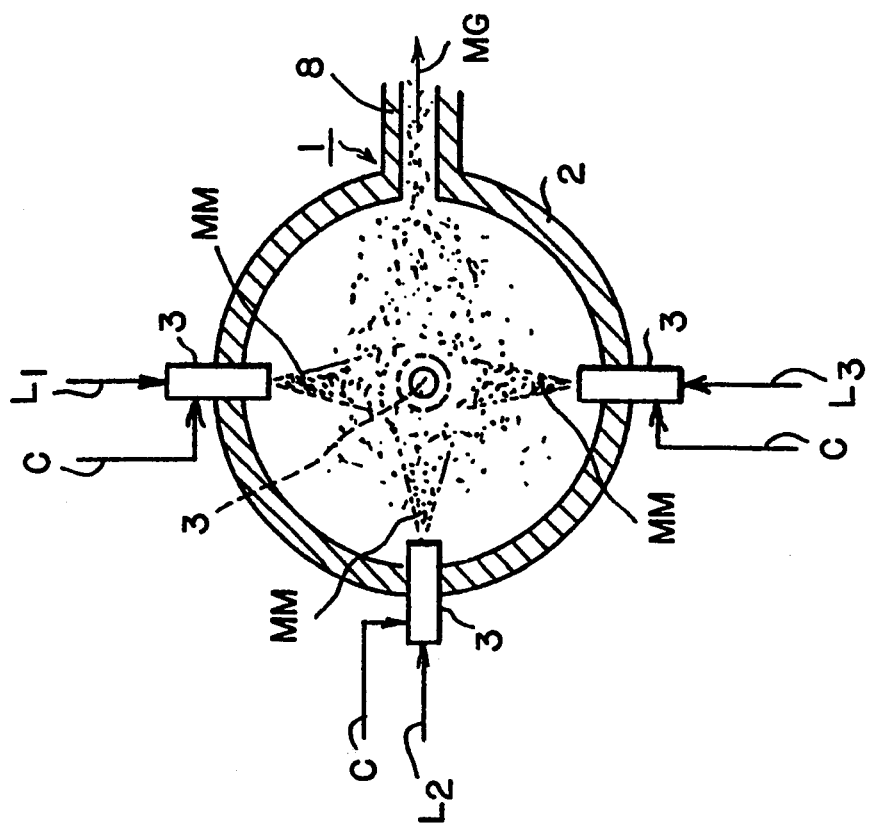
FIG. 6 is a sectional view of a fifth preferred embodiment of the liquid vaporizer/feeder according to the present invention.

FIG. 6 depicts a fifth preferred embodiment, where a vaporizer 1D is spherical and plurality of mist nozzles 3 are fixed radially towards the center of the vaporizer 1D so that various feedstock gases and carrier gas can be mixed in a spherical evaporation space ES. Especially because of a spherical shape of the evaporation space ES, uniformity of the mixture is improved.

In FIG. 2, since the vaporizer 1 has a simple configuration consisting of the cylindrical main vaporizer unit 2 and the flanges 2d and 2e, it costs very low in manufacturing, and additionally, it can be disassembled only by removing the flanges 2d and 2e for maintenance, check, cleaning, etc. Moreover, since its configuration is very simple, as mentioned above, it can have a very compact design.

FIG. 7 depicts a graph of data of output mass flow recorded by a monitor mass flowmeter (not shown) positioned in a downstream side of the vaporizer 1. The horizontal axis of the graph represents time while the vertical axis represents output voltage from the mass flowmeter. When the carrier gas begins flowing at time t1, the output voltage reaches V1 and constantly keeps the level for a while. TEOS begins flowing at time t2. It is vaporized in the above mentioned method and mixed with the carrier gas, and when the mixed gas flows, the output voltage rises to V2. If TEOS is kept at a constant flow rate by the liquid mass flow meter, LC continuously flows and is vaporized by the vaporizer 1, the output voltage from the monitor mass flowmeter accordingly keeps the fixed level V2. This proves that vaporization of the liquid feedstock is performed perfectly (100%). When feeding of TEOS is stopped at time t3, the carrier gas alone still flows, and therefore the output voltage from the monitor mass flowmeter falls to V1 again. When feeding of the carrier gas is stopped at time t4, the output voltage further falls to 0 V.

While the invention has been shown and described in detail, the foregoing description is in all aspects illustrative and not restrictive. It is therefore understood that numerous modifications and variations can be devised without departing from the scope of the invention.

What is claimed is:

1. A liquid vaporizer/feeder comprising
   a main vaporizer unit including
   a heating and thermal insulating unit which has a heating cylinder in an innermost position, a heater enclosing the heating cylinder, and a heat insulator further enclosing the heater, and
   flanges attached to an inlet and an outlet of the heating and thermal insulating unit;
   the heating cylinder having an evaporation space therein;
   a mist nozzle including
   an inside nozzle connected to a terminal end of a liquid feedstock feeding pipe extending from a liquid feedstock reservoir through a liquid mass flow controller, and fixed in a flange at the inlet of the main vaporizer unit, for feeding liquid feedstock into the main vaporizer unit, and
   an outside nozzle connected to a terminal end of a carrier gas feeding pipe extending from a carrier gas pressure tank through a pressure regulator and a mass flowmeter, fixed in the flange at the inlet of the main vaporizer unit, and encompassing an opening of the inside nozzle, for forcing a carrier gas at a high speed around the opening of the inside nozzle; and
   a discharging pipe connected to the flange at the outlet of the main vaporizer unit and connected via a valve to a furnace; and
   a purge pipe having a valve and connected as a bypass to the discharging pipe at a position upstream from the valve of the discharging pipe.

2. A liquid vaporizer/feeder as set forth in claim 1, in which said main vaporizer unit is cylindrical in shape, and
   said main vaporizer unit includes a cylindrical space in which the liquid feedstock mist is mixed with the carrier gas and the liquid feedstock mist that is forced out of the mist nozzle is vaporized and mixed with the carrier gas.

3. A liquid vaporizer/feeder according to claim 1, wherein a plurality of liquid feedstock feeding pipes are connected to said inside nozzle.

4. A liquid vaporizer/feeder according to claim 1, wherein a plurality of mist nozzles are fixed in said main vaporizer unit.

* * * * *